(12) United States Patent
Pitio

(10) Patent No.: US 6,671,833 B2
(45) Date of Patent: Dec. 30, 2003

(54) FORWARD ERROR CORRECTION AND FRAMING PROTOCOL

(75) Inventor: Walter Michael Pitio, Morganville, NJ (US)

(73) Assignee: Parama Networks, Inc., Santa Clara, CA (US)

(*) Notice: Subject to any disclaimer, the term of this patent is extended or adjusted under 35 U.S.C. 154(b) by 208 days.

(21) Appl. No.: 10/041,371

(22) Filed: Jan. 8, 2002

(65) Prior Publication Data
US 2003/0131310 A1 Jul. 10, 2003

(51) Int. Cl.[7] .............................................. H03M 13/27
(52) U.S. Cl. ........................................ 714/701; 714/804
(58) Field of Search .................................. 714/701, 804

(56) References Cited

U.S. PATENT DOCUMENTS

| 3,831,144 A | * | 8/1974 | En ............................. 714/804 |
| 4,044,328 A | * | 8/1977 | Herff ........................... 714/804 |
| 4,336,612 A | * | 6/1982 | Inoue et al. ................. 714/755 |
| 4,549,298 A | * | 10/1985 | Creed et al. ................. 714/758 |
| 5,107,505 A | * | 4/1992 | Lelandais et al. ........... 714/755 |
| 5,719,875 A | * | 2/1998 | Wei ............................. 714/701 |
| 5,898,710 A | * | 4/1999 | Amrany ...................... 714/786 |
| 6,275,965 B1 | * | 8/2001 | Cox et al. ................... 714/755 |

* cited by examiner

Primary Examiner—Stephen M. Baker
(74) Attorney, Agent, or Firm—DeMont & Breyer, LLC

(57) ABSTRACT

A serializer and deserializer are disclosed that provide an efficient scheme for both forward error correction and symbol alignment and frame alignment by the deserializer. In particular, the illustrative embodiment provides an efficient method for generating row and column parity bits for an S by K-bit matrix that can, in some cases, require fewer that S+K parity bits. This is particularly useful for when a single word is broken up and its pieces are sent via different serial communications channels and the deserializer needs to be capable of properly reassembling the fragments into the word.

3 Claims, 8 Drawing Sheets

FORWARD ERROR CORRECTION AND FRAMING PROTOCOL

FIELD OF THE INVENTION

The present invention relates to telecommunications in general, and, more particularly, to an apparatus for converting one or more parallel words into one or more serialized streams of bits and back again into parallel words.

BACKGROUND OF THE INVENTION

There are situations where parallel words of data need to be transmitted via a serial communications channel. In these situations, a first apparatus converts the words into a serialized stream of bits for transmission on the serial communications channel. Typically the first apparatus is known as a serializer.

At the receiving end of the serial communications channel, a second apparatus captures the serialized stream of bits and restores it back into parallel words. Typically, the second apparatus is known as a deserializer. Regardless of what the first apparatus and the second apparatus are called, the second apparatus performs the inverse operation of the first apparatus.

FIG. 1 depicts a block diagram of serial communications system 100 in the prior art, which comprises: serializer 101, deserializer 102, timing source 103, timing source 104, and serial communications channel 111, interconnected as shown.

Serializer 101 receives a parallel word of bits and a timing signal (e.g., a clock signal, etc.) from timing source 103 and converts the parallel word into a serialized stream of bits for transmission via serial communications channel 111. For example, serializer 101 can comprise a parallel-load-in/serial-shift-out register that loads words in at a slower rate than it shifts bits out.

Serial communications channel 111 is a logical channel that can be carried alone on a physical channel or can be multiplexed with other logical channels on a physical channel (e.g., a metal wireline, an optical fiber, or a wireless channel, etc.).

Deserializer 102 receives the serialized stream of bits from serial communications channel 111 and a clock signal from timing source 104, captures the serialized stream of bits, and converts it back into a parallel word. For example, deserializer 102 can comprise a serial-shift-in/parallel-unload-out shift register.

The design and operation of serializer 101 and deserializer 102 can be problematic. For example, if a bit error occurs during the transmission of the serialized stream of bits, the error might not be detected or corrected by the deserializer. Furthermore, if the word is broken up and its pieces are sent via different serial communications channels, the deserializer can fail to properly reassemble the fragments back into a word.

Therefore, the need exists for a serializer and a deserializer that are capable of detecting and/or correcting one or more bit errors that occur during the transmission of the serialized stream of bits. Furthermore, the need exists for a serializer and a deserializer that are capable of breaking up a word into pieces for transmission via different serial communications channels and of properly reassembling the fragments back into a word.

SUMMARY OF THE INVENTION

Some embodiments of the present invention enable the serialization of words without some of the costs and disadvantages for doing so in the prior art. For example, the illustrative embodiment provides an efficient scheme for forward error correction (i.e., the correction of bit errors by the receiver without the retransmission of the data by the transmitter). In particular, the illustrative embodiment provides an efficient method for generating row and column parity bits for an S by K-bit matrix that can, in some cases, require fewer than S+K parity bits.

Furthermore, the illustrative embodiment provides both symbol alignment and frame alignment by the deserializer in an efficient manner. This is particularly useful for when a single word is broken up and its pieces are sent via different serial communications channels and the deserializer needs to be capable of properly reassembling the fragments into the word.

The illustrative embodiment comprises: receiving a matrix C of bits, wherein the matrix C has dimensions of S by K and wherein both S and K are positive integers; generating a plurality of row parity bits that are indicative of the parity of a row of bits in a matrix D that has dimensions of S/y by yK, wherein S/y and yK are positive integers, wherein y is a positive integer other than one, and wherein matrix D is based on a shuffling function of matrix C; and transmitting the matrix C of bits and the plurality of row parity bits.

DETAILED DESCRIPTION

Figure 1:
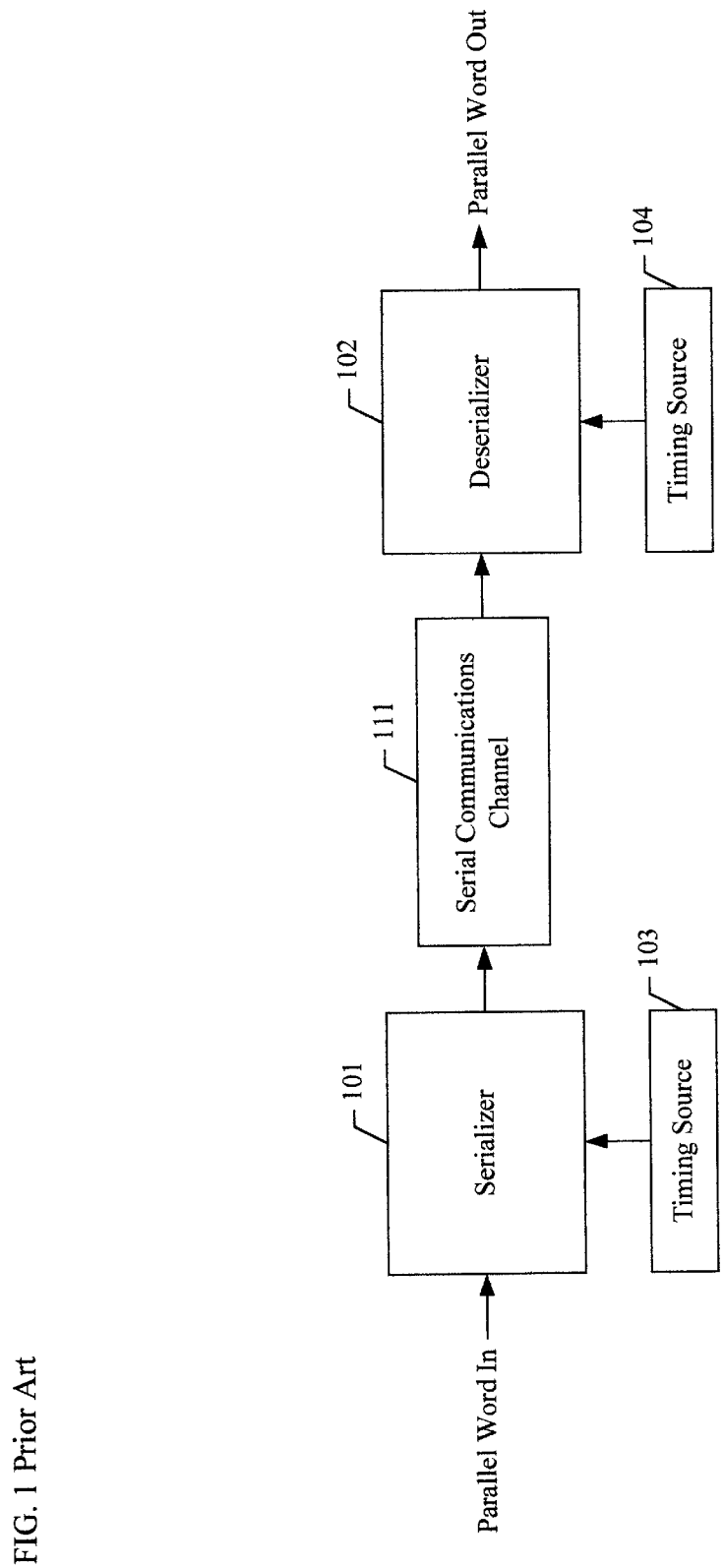
FIG. 1 depicts a block diagram of serial communications system 100 in the prior art.
Figure 2:
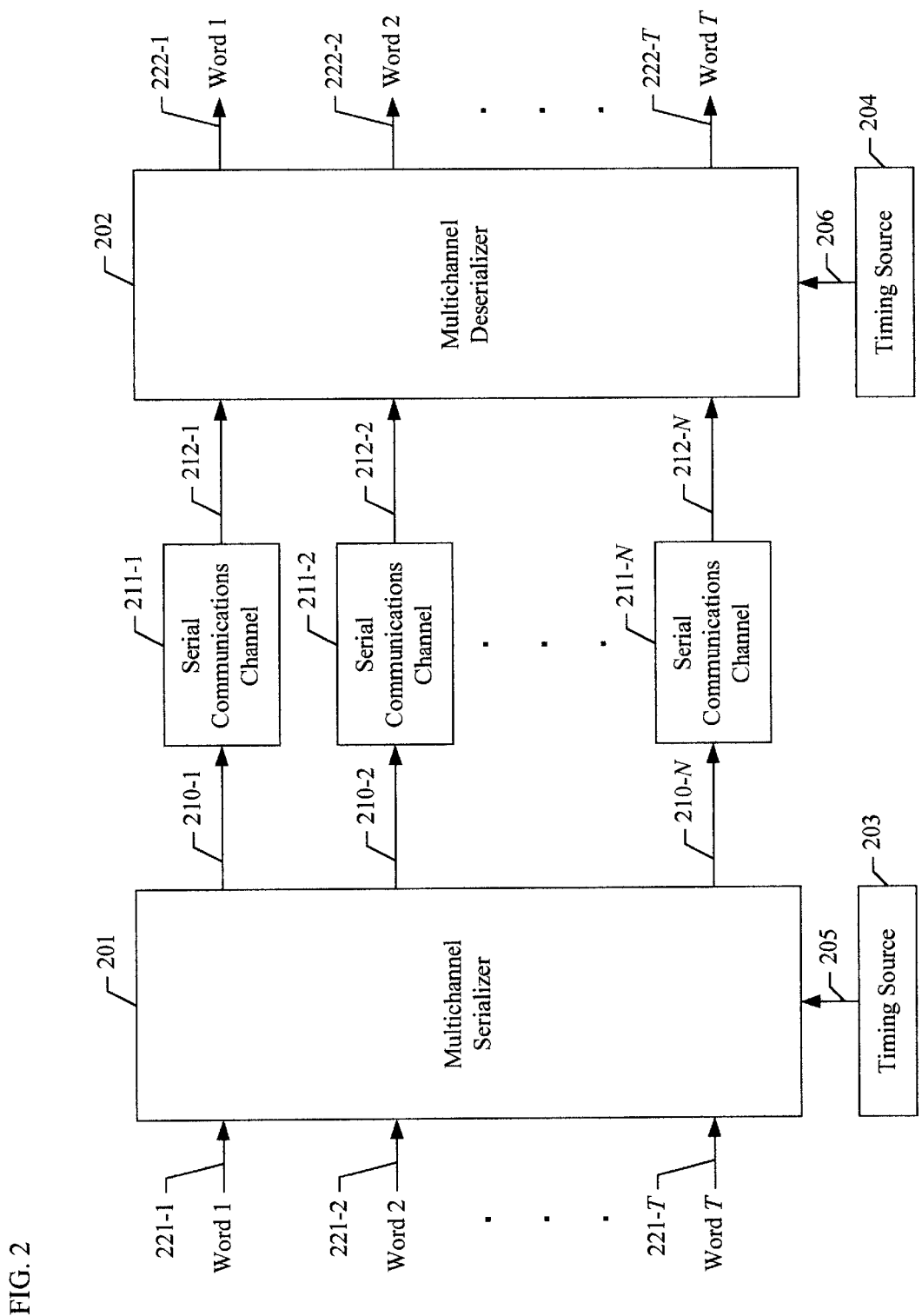
FIG. 2 depicts a block diagram of the first variation of the illustrative embodiment of the present invention.

FIG. 2 depicts a block diagram of the first variation of the illustrative embodiment of the present invention, which comprises: multichannel serializer 201, multichannel deserializer 202, N serial communications channels 211-1 through 211-N, wherein N is a positive integer greater than zero, timing source 203, and timing source 204, all of which are interconnected as shown. In accordance with the first variation of the illustrative embodiment of the present invention, multichannel serializer 201 and multichannel deserializer 202 are each provided with clock signals that are independent of, and asynchronous to, each other.

Figure 3:
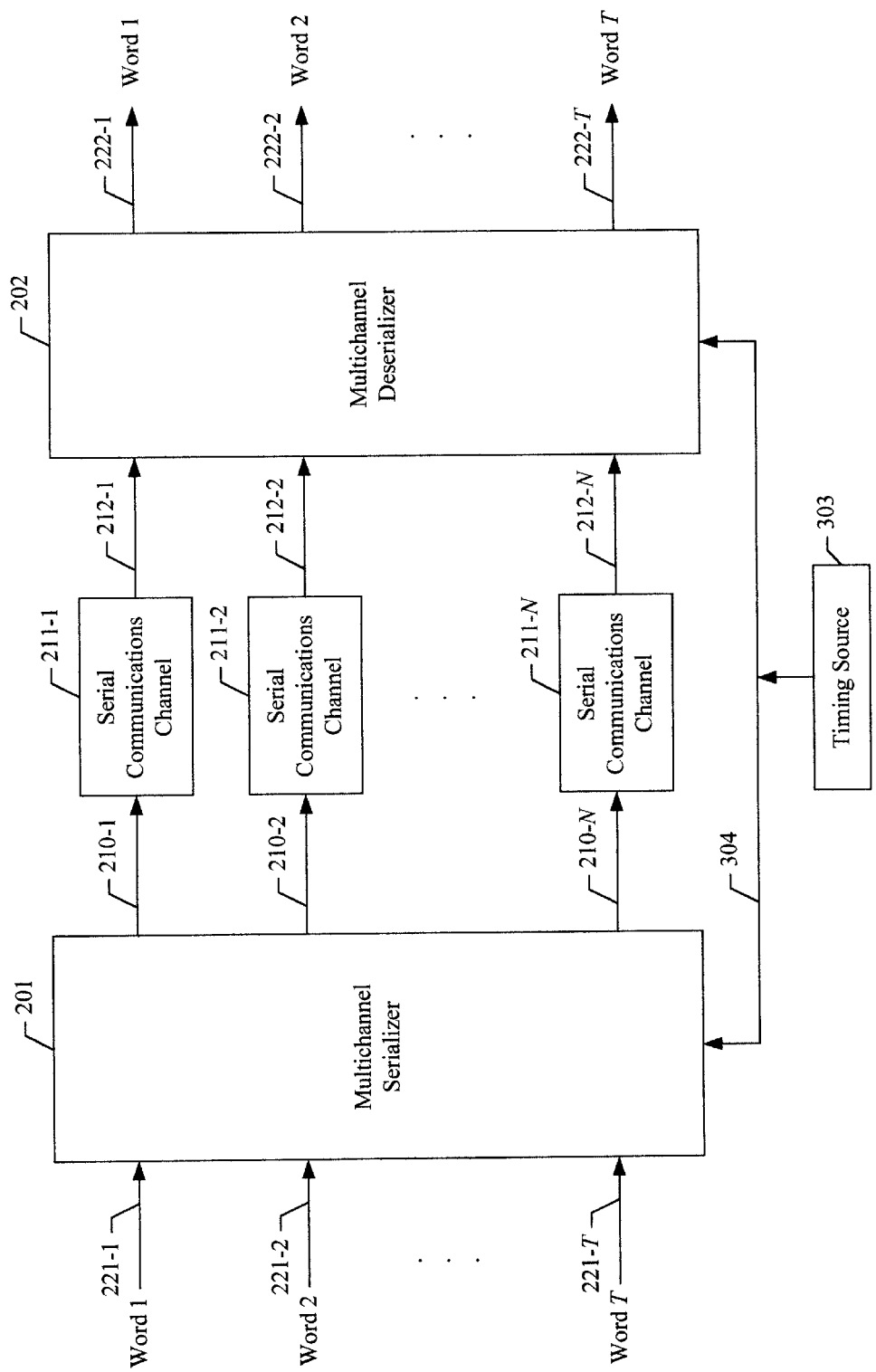
FIG. 3 depicts a block diagram of the second variation of the illustrative embodiment of the present invention.

FIG. 3 depicts a block diagram of the second variation of the illustrative embodiment of the present invention, which comprises: multichannel serializer 201, multichannel deserializer 202, N serial communications channels 211-1 through 211-N, wherein N is a positive integer greater than zero, and timing source 303, all of which are interconnected as shown. In accordance with the second variation of the illustrative embodiment of the present invention, multichannel serializer 201 and multichannel deserializer 202 are each provided with a clock signal from the same timing source.

In yet a third variation of the illustrative embodiment, which is not depicted in the Figures, multichannel deserializer 202 derives the timing signal at which to deserialize the bit stream from one or more of the serialized bit streams themselves. In this variation, the illustrative embodiment can use one or more synchronized oscillators (e.g., phase-locked loops, etc.) to derive the timing signal at which to deserialize the bit stream. In all other respects that are germane to the present invention, the three variations of the illustrative embodiment are identical, and, therefore, will be described as one.

With reference to both FIGS. 2 and 3, there are 64 serial communications channels between multichannel serializer 201 and multichannel deserializer 202 (i.e., N=64). In accordance with the illustrative embodiment, each of serial communications channels 211-1 through 211-N is a distinct physical channel and is carried by a distinct optical fiber. In some alternative embodiments of the present invention, each of serial communications channels 211-1 through 211-N is a logical channel, and, therefore, some of them are multiplexed and transmitted to multichannel deserializer 202 via a single physical channel (e.g., metal wireline, an optical fiber, or a wireless channel, etc.). After reading this specification and the accompanying figures, it will be clear to those skilled in the art how to make and use embodiments of the present invention in which N equals a value of other than 64.

Multichannel serializer 201 receives T parallel words, $word_1$ through $word_T$, wherein T is a positive integer greater than zero, on buses 221-1 through 221-T, respectively, and a clock signal from a timing source (e.g., timing source 203, timing source 303, etc.). Multichannel serializer 201 outputs a serialized version of $word_1$ through $word_T$ to serial communications channels 211-1 through 211-N, respectively. In accordance with the illustrative embodiment, T=16. After reading this specification and the accompanying figures, it will be clear to those skilled in the art how to make and use embodiments of the present invention in which T equals a value of other than 16.

In accordance with the illustrative embodiment of the present invention, each of words $word_1$ through $word_T$ comprises W bits, wherein W is a positive integer greater than zero. In accordance with the illustrative embodiment, W=32. After reading this specification and the accompanying figures, it will be clear to those skilled in the art how to make and use embodiments of the present invention in which W equals a value of other than 32. Furthermore, after reading this specification and the accompanying figures, it will be clear to those skilled in the art how to make and use embodiments of the present invention in which some of $word_1$ through $word_T$ comprise a different number of bits than others of $word_1$ through $word_T$ comprise.

When multichannel serializer 201 multiplexes two or more bits from a single word over one serial communications channel, all of the bits from the word that are multiplexed over the same serial communications channel are called a "symbol." In accordance with the illustrative embodiment of the present invention, each word of $word_1$ through $word_T$ comprises M symbols, wherein M is equal to N/T. In accordance with the illustrative embodiment, M=N/T=64/16=4. After reading this specification and the accompanying figures, it will be clear to those skilled in the art how to make and use embodiments of the present invention in which M equals a value of other than 4. Furthermore, after reading this specification and the accompanying figures, it will be clear to those skilled in the art how to make and use embodiments of the present invention in which some of $word_1$ through $word_T$ comprise a different number of symbols than others of words $word_1$ through $word_T$.

In accordance with the illustrative embodiment, there are K=W/M bits in each "unencoded" symbol before it is encoded with parity or framing bits or both parity and framing bits. In accordance with the illustrative embodiment, the number of bits in each unencoded symbol equals K=W/M=32/4=8.

In accordance with the illustrative embodiment, each unencoded symbol is scrambled with a deterministically invertable function, $\Psi(\ )$, to increase the likelihood that any given bits is a "1" to 50%, which increases the transition density on the serial communications channel and increases the likelihood that symbol and frame alignment will be performed correctly by the deserializer. The process of scrambling neither adds nor removes bits nor adds nor removes redundancy from the unencoded symbol. The process for scrambling is described in detail below.

Furthermore, each scrambled and unencoded symbol is encoded with parity bits for the purpose of forward error correction. The forward error correction technique employed by the illustrative embodiment is described in detail below.

And still furthermore, and to facilitate symbol and word synchronization by deserializer 202, each scrambled and unencoded symbol is also encoded with framing bits. The framing technique employed by the illustrative embodiment is described in detail below.

In all cases, the number of bits transmitted with respect to each symbol is B=K+Z, wherein Z equals the number of bits added to the symbol as parity and framing bits.

In accordance with the illustrative embodiment, the bits in each symbol are encoded with 2 additional bits, and, therefore, Z=2 and B=K+Z=32/4+2=10. How these two additional bits are generated and transmitted is described in detail below. After reading this specification and the accompanying figures, it will be clear to those skilled in the art how to make and use embodiments of the present invention in which the bits in each symbol are encoded with a different number of additional bits.

In accordance with the illustrative embodiment, multichannel serializer 201 uses a binary modulation scheme (e.g., binary shift-keying, etc.) and transmits each bit independently over a serial communications channel. In some alternative embodiments of the present invention however, multichannel serializer combines the bits from two or more serial communications channels using a non-binary modulation scheme (e.g., quadriphase-shift keying, etc.) and transmits multiple bits simultaneously over a serial communications channel.

Multichannel serializer 201 outputs N sets of B bits onto each of serial communications channels 211-1 through 211-N for each set of T words received by multichannel serializer 201. The details of multichannel serializer 201 are described below and with respect to FIGS. 4 through 8. Multichannel serializer 201 operates in pipeline-processor fashion, meaning that it continually receives one set of T parallel words after another and transmits N sets of B bits onto each of serial communications channels 211-1 through 211-N for each set of T words received by it.

In accordance with the illustrative embodiment, the propagation delay through each of serial communications channels 211-1 through 211-N need not be the same nor need it remain constant throughout time.

Multichannel deserializer 202 receives a serialized stream of bits from each of serial communications channels 211-1 through 211-N, and a clock signal (e.g., from timing source 204, from timing source 303, etc.), and from them reconstructs and outputs T parallel words, word$_1$ through word$_T$, on buses 222-1 through 222-T. Furthermore, multichannel deserializer 202 operates in pipeline-processor fashion, meaning that it continually outputs one set of T parallel words after another for each of the N sets of B bits it receives from serial communications channels 211-1 through 211-N.

Timing source 204/303 generates a plurality of differently-phased timing signals for multichannel serializer 201. To this end, timing source 204/303 generates B timing signals, $\Phi_0$ through $\Phi_B$, each with the same frequency but 360°/B out of phase with respect to each other. The frequency of each of the timing signals equals the frequency with which words are loaded into multichannel serializer 201.

For example, in accordance with the illustrative embodiment, B=10 and, therefore, timing source 204/303 generates ten (10) clock signals depicted in Table 1.

TABLE 1

Clock signals From Timing Source 204/303 (for B = 10)

| Clock Signal No. | Phase |
|---|---|
| $\Phi_0$ | 0° |
| $\Phi_1$ | 36° |
| $\Phi_2$ | 72° |
| $\Phi_3$ | 108° |
| $\Phi_4$ | 144° |
| $\Phi_5$ | 180° |
| $\Phi_6$ | 216° |
| $\Phi_7$ | 252° |
| $\Phi_8$ | 288° |
| $\Phi_9$ | 324° |

It will be clear to those skilled in the art how to make and use timing source 204/303.

Figure 4:
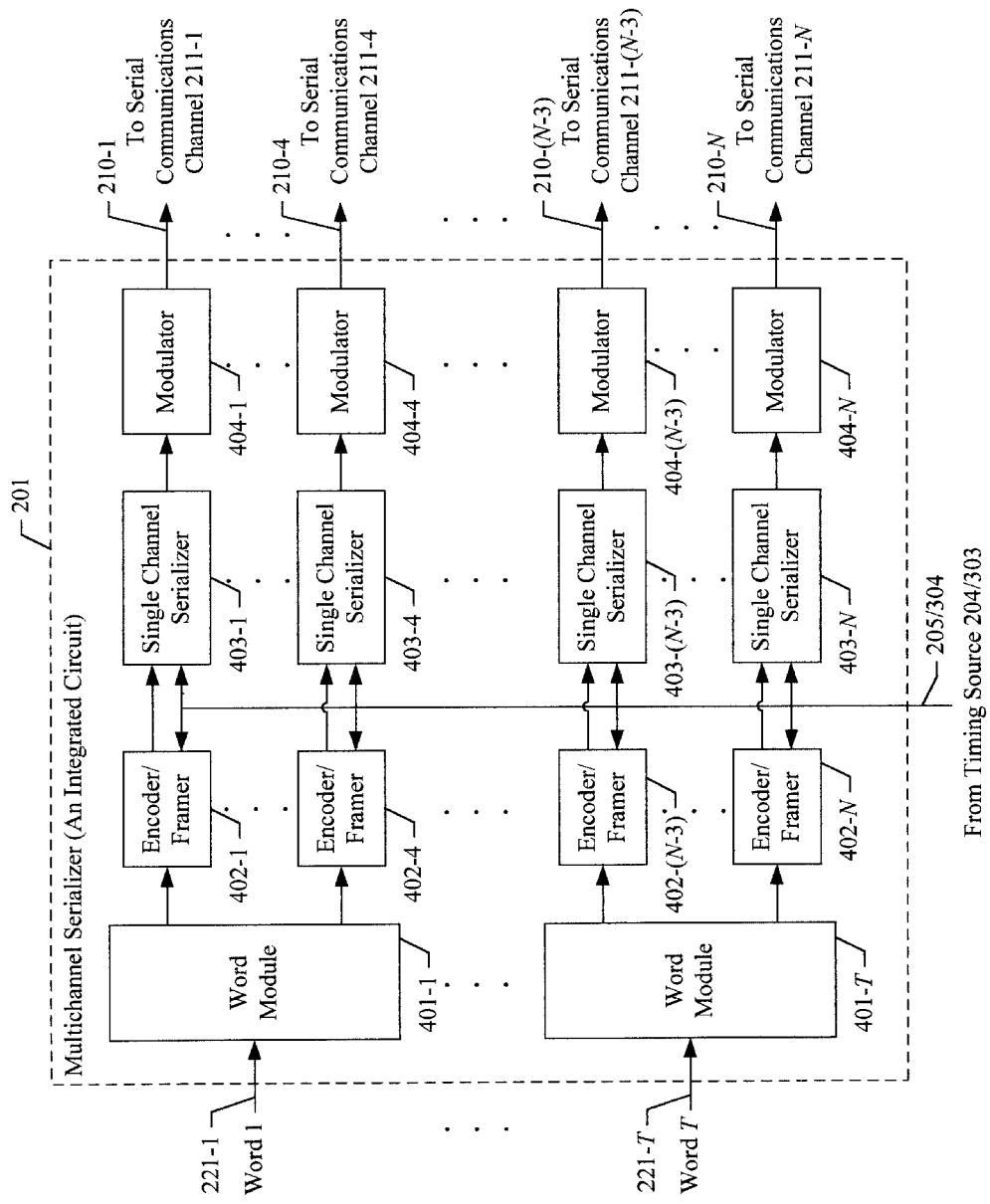
FIG. 4 depicts a block diagram of the salient components of multichannel serializer 201, as depicted in FIGS. 2 and 3.

FIG. 4 depicts a block diagram of the salient components of multichannel serializer 201, which comprises: T word modules 401-1 though 401-T, N encoder/framers 402-1 through 402-N, N single channel serializers 403-1 through 403-N, and N modulators 404-1 through 404-N, interconnected as shown.

In accordance with the illustrative embodiment, multichannel serializer 201 is fabricated on an integrated circuit. For the purposes of this specification, the term "integrated circuit" is defined as a slice or chip of material on which is etched or imprinted a complex of electronic components and their interconnections.

Word module 401-$f$, for f=1 to T, receives a W-bit word from bus 221-$f$ divides the W-bit word into M K-bit unencoded symbols, and distributes each of the K-bit unencoded symbols to one of the encoder/framers associated with word module 401-$f$. In the illustrative embodiment, each word module receives 32 bits, divides the 32 bits into four unencoded symbols of 8 bits each, and distributes each unencoded symbol to one of the four encoder/framers associated with the word module.

Encoder/framer 402-$i$, for i=1 to N, receives S consecutive groups of K bits, b$_0$ through b$_{K-1}$, in parallel and timing signal $\Phi_0$ from timing source 204/303 and outputs an S by K+2 array of S(K+2) bits that are represented by a two-dimensional matrix G, as described below, to single channel serializer 403-$i$. Encoder/framer 402-$i$ is described in detail below and with respect to FIG. 5.

Single channel serializer 403-$i$ receives the two-dimensional matrix G from encoder/framer 402-$i$ and timing signal $\Phi_0$ from timing source 204/303 and serializes the matrix G onto serial communications channel 211-$i$. U.S. patent application Ser. No. 10/011,938, filed on Dec. 5, 2001, and entitled "Serializer" is incorporated by reference and teaches one technique for making and using single channel serializer 403-$i$.

Modulator 404-$i$ receives the serialized bit stream from single channel serializer 403-$i$ and modulates it, in well-known fashion, onto serial communications channel 221-$i$.

Figure 5:
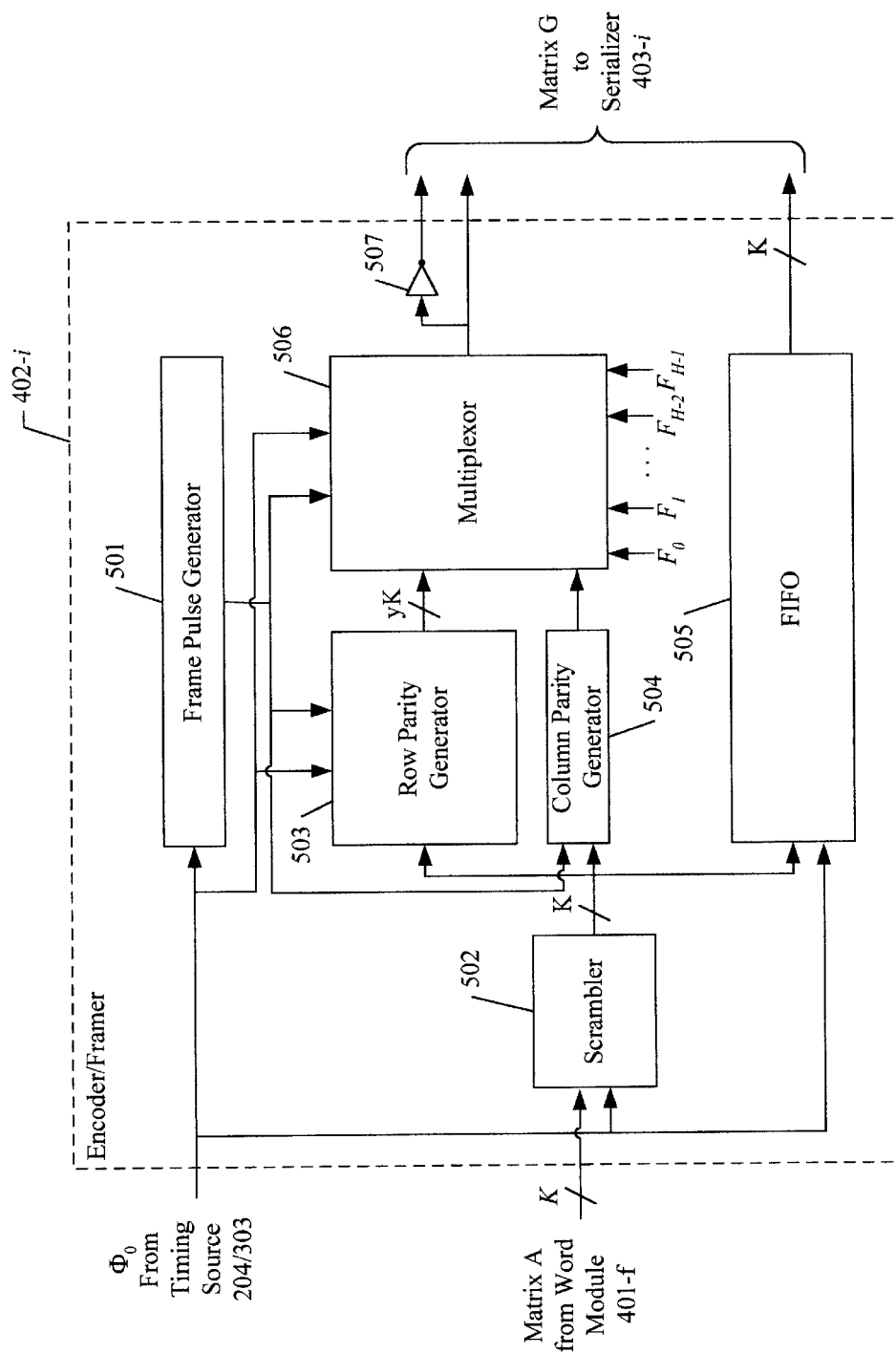
FIG. 5 depicts a block diagram of the salient components of encoder/framer 402-i, as depicted in FIG. 4.

FIG. 5 depicts a block diagram of the salient components of encoder/framer 402-$i$, which comprises: frame pulse generator 501, scrambler 502, row parity generator 503, column parity generator 504, first-in-first-out memory ("FIFO") 505, multiplexor 506, and inverter 507, interconnected as shown.

In accordance with the illustrative embodiment, encoder/framer 402-$i$ operates on each set of S consecutive K-bit unencoded symbols as a unit or "frame," wherein S is a positive integer greater than zero. In particular, every S sets of K-bit symbols are treated as an S by K array of SK bits that are represented by the two-dimensional matrix A.

$$A = \begin{bmatrix} a_{0,0} & \cdots & a_{0,S-1} \\ \vdots & \ddots & \vdots \\ a_{K-1,0} & \cdots & a_{K-1,S-1} \end{bmatrix} \quad \text{(Eq. 1)}$$

Encoder/framer 402-1 operates on S symbols as a unit because of efficiencies and opportunities that arise when multiple symbols are operated on together that are not possible or are less feasible or are less efficient when only individual symbols are considered.

In accordance with the illustrative embodiment, S=64. After reading this specification it will be clear to those skilled in the art how to make and use embodiments of the present invention in which S equals a value of other than 64.

To ensure that all of the components of encoder/decoder 402-$i$ treat the same S symbols as one frame, frame pulse generator 501 generates a "framing pulse" that delineates the end of one frame and the beginning of the next. The framing pulse is generated once every S cycles of timing signal $\Phi_0$ and is distributed to row parity generator 503, column parity generator 504, and multiplexor 506.

In accordance with the illustrative embodiment, scrambler 501 performs a deterministically invertable function, $\Psi(\ )$, on A (i.e., $\Psi(\ )$ is deterministically invertible if and only if C=$\Psi$(A) and A=$\Psi'$(C)), in well-known fashion. The output of scrambler 501 can be conceptualized as an S by K array of SK bits that are represented by the two-dimensional matrix C, wherein:

$$C = \Psi(A) \quad \text{(Eq. 2)}$$

and:

$$C = \begin{bmatrix} c_{0,0} & \cdots & c_{0,S-1} \\ \vdots & \ddots & \vdots \\ c_{K-1,0} & \cdots & c_{K-1,S-1} \end{bmatrix} \quad \text{(Eq. 3)}$$

Matrix C is transmitted to row parity generator 503, column parity generator 504, and FIFO 505 K-bits at a time via a K-bit wide bus.

In accordance with the illustrative embodiment, yK "row" parity bits and S/y "column" parity bits are generated based on C, wherein yK and S/y are positive integers greater than zero. In accordance with the illustrative embodiment, y=2. In some alternative embodiments of the present invention, y equals a value other than 2 (e.g., ½, ⅓, ¼, 3, 4, etc.) and after reading this specification it will be clear to those skilled in the art how to make and use embodiments of the present invention in which y equals a value other than 2.

The row parity bits and column parity bits enable multi-channel deserializer 202 to correct and/or detect some bit errors in C that result during the transmission of C from multichannel serializer 201 to multichannel deserializer 202.

In accordance with the illustrative embodiment, row parity generator 503 generates yK "row" parity bits, $RP_p$, for p=0 to yK−1, such that:

$$RP_p = \begin{cases} \left(\sum_{i=0}^{\frac{S}{y}-1} c_{p,i}\right) \bmod 2 & \text{for } p = 0 \text{ to } K - 1 \\ \left(\sum_{i=\frac{S}{y}}^{S-1} c_{p,i}\right) \bmod 2 & \text{for } p = K \text{ to } yK - 1 \end{cases} \quad \text{(Eq. 4a)}$$

The yK row parity bits are output from row parity generator 503 to multiplexor 506 via a yK width bus after the conclusion of the receipt of C by row parity generator 503. After reading this specification, it will be clear to those skilled in the art how to transmit the yK row parity bits from row parity generator 503 to multiplexor 506 serially or via a different width bus.

In accordance with the illustrative embodiment, column parity generator 504 generates S/y "column" parity bits, $CP_q$, for q=0 to S/y−1, such that:

$$CP_q = \left(\sum_{j=0}^{K-1} (c_{j,q} + c_{j+K,q})\right) \bmod 2 \quad \text{(Eq. 5a)}$$

The S/y column parity bits are output from column parity generator 504 to multiplexor 506 serially after the conclusion of the receipt of C by column parity generator 504. After reading this specification, it will be clear to those skilled in the art how to transmit the S/y column parity bits from row parity generator 503 to multiplexor 506 via a bus.

The parity bits $RP_p$ and $CP_q$ are called "row" and "column" parity bits, respectively, not because they are based on the rows and columns of C, but rather because they are based on the rows and columns of a matrix D that is based on a "shuffling" function, $\Lambda(\ )$, of C. In particular:

$$D = \Lambda(C) \quad \text{(Eq. 6)}$$

and $$D = \begin{bmatrix} c_{0,0} & \cdots & c_{0,\frac{S}{2}-1} \\ \vdots & \ddots & \vdots \\ c_{K-1,0} & \cdots & c_{K-1,\frac{S}{2}-1} \\ c_{0,\frac{S}{2}} & \cdots & c_{0,S-1} \\ \vdots & \ddots & \vdots \\ c_{K-1,\frac{S}{2}} & \cdots & c_{K-1,S-1} \end{bmatrix} = \begin{bmatrix} d_{0,0} & \cdots & d_{0,\frac{S}{2}-1} \\ \vdots & \ddots & \vdots \\ d_{2K-1,0} & \cdots & d_{2K-1,\frac{S}{2}-1} \end{bmatrix} \quad \text{(Eq. 4)}$$

The number of row and column parity bits needed for a matrix is equal to one-half of the perimeter of the matrix (i.e., one bit for each column and each row of the matrix).

In particular, when the row and column parity bits are based on the rows and columns, respectively, of the matrix C, the total number of row and column parity bits is S+K (i.e., one bit for each column and each row of matrix C). In contrast, when the row and column parity bits are based on the rows and columns, respectively, of the matrix D, the total number of row and column parity bits is S/y+yK (i.e., one bit for each column and each row of matrix D). In summary, a more "square" matrix requires fewer row and column parity bits than a less "square" matrix. For the purposes of this specification, matrix D is defined to be more "square" than matrix C when (S/y+yK)<(S+K). And because matrix D is merely a shuffled version of matrix D, the information contained in matrix D is equivalent to the information contained in matrix C.

For the purposes of this specification, a "shuffling function" of a matrix is defined as the transposition of an S by K matrix into an S/y by yK matrix, wherein S, K, yK and S/y are all positive integers greater than zero, and y is a positive number other than one (1). The fewest number of row and column bits are needed when the sum of S/y+yK is minimized.

For example, the S=64 by K=8 matrix C can be shuffled into many forms as shown in Table 2. As can be seen in Table 2, the fewest number of row and column bits are needed when y=2 and y=4, and in accordance with the illustrative embodiment, y=2.

TABLE 2

Candidate Dimensions for Matrix D

| y | S/y | yK | S/y + yK |
|---|-----|-----|----------|
| 64 | 1 | 512 | 513 |
| 32 | 2 | 256 | 258 |
| 16 | 4 | 128 | 132 |
| 8 | 8 | 64 | 72 |
| 4 | 16 | 32 | 48 |
| 2 | 32 | 16 | 48 |
| ½ | 128 | 4 | 132 |
| ¼ | 256 | 2 | 258 |
| ⅛ | 512 | 1 | 513 |

In terms of matrix D, the row parity bits are based on the even parity of each row of matrix D. In particular, row parity bit, $RP_p$, for p=0 to yK−1, equals:

$$RP_p = \left(\sum_{i=0}^{\frac{S}{2}-1} d_{p,i}\right) \bmod 2 \quad \text{(Eq. 4b)}$$

In terms of matrix D, the column parity bits are based on the even parity of each column of matrix D. In particular, column parity bit $CP_q$, for q=0 to S/y−1, equals:

$$CP_q = \left(\sum_{j=0}^{2K-1} d_{j,q}\right) \bmod 2 \quad \text{(Eq. 5b)}$$

After reading this specification, it will be clear to those skilled in the art how to make and use embodiments of the present invention that use other shuffling functions. Furthermore, after reading this specification, it will be clear to those skilled in the art how to make and use embodiments of the present invention that use odd parity for the row parity bits or the column parity bits or both the row parity bits and the column parity bits. And still furthermore, after reading this specification, it will be clear to those skilled in the art how to make and use embodiments of the present invention in which matrix D is also based on a transposition of matrix C.

In addition to the row parity bits and the column parity bits, encoder/framer 402-$i$ also generates and transmits framing bits, which facilitate frame synchronization by multichannel deserializer 202. In particular, the illustrative embodiment advantageously generates H framing bits, $F_0$ through $F_{H-1}$, where H equals:

$$H = S - yK - \frac{S}{y} \quad \text{(Eq. 7)}$$

In accordance with the illustrative embodiment, S=64, K=8, and y=2, and, therefore, H=64−16−32=16. In accordance with the illustrative embodiment, $F_0$=1 and $F_1$ through $F_{H-1}$ equal 0. After reading this specification, it will be clear to those skilled in the art how to make and use embodiments of the present invention in which the framing bits, $F_0$ through $F_{H-1}$, have a different value. Another reason for computing the row and column parity bits based on matrix D, rather than on matrix C, is to free up bits to be used for framing.

Multiplexor 506 receives the yK row parity bits, the S/y column parity bits and the H framing bits and from them constructs an S-bit vector, $R_0$ through $R_{S-1}$. In particular:

$$R = [R_0 \cdots R_{S-1}] = \quad \text{(Eq. 8)}$$
$$[F_0 \cdots F_{H-1} \; RP_0 \cdots RP_{2K-1} \; CP_0 \cdots CP_{\frac{S}{2}-1}]$$

After reading this specification, it will be clear to those skilled in the art how to make and use embodiments of the present invention in which the vector R' is any transposition of that shown in Equation 8. For example:

$$R' = [F_0 \; CP_1 \; RP_0 \; CP_0 \; F_1 \; CP_2 \; RP_1 \; CP_3 \; F_2 \cdots F_{K-1} \; CP_{\frac{S}{2}-2} \; RP_{K-1} \; CP_{\frac{S}{2}-1}] \quad \text{(Eq. 8b)}$$

FIFO 505 holds matrix C until multiplexor 506 is ready to output the vector R associated with matrix C, in well-known fashion.

Multiplexor 506 outputs the vector R directly to serializer 403-$i$ and through inverter 507 to serializer 403-$i$, which creates an inverted copy of vector R, $\overline{R}$, so that, overall, the output of encoder/framer 402-$i$ is an S by K+2 array of S(K+2) bits that are represented by the two-dimensional matrix G, wherein:

$$G = \begin{bmatrix} \overline{R_0} & \cdots & \overline{R_{S-1}} \\ R_0 & \cdots & R_{S-1} \\ c_{0,0} & \cdots & c_{0,S-1} \\ \vdots & \ddots & \vdots \\ c_{K-1,0} & \cdots & c_{K-1,S-1} \end{bmatrix} \quad \text{(Eq. 9)}$$

An inverted copy of the vector R, $\overline{R}$, is generated by encoder/framer 402-$i$ and transmitted as part of the matrix G to facilitate symbol synchronization by multichannel deserializer 202. The advantage of transmitting both the vector R and an inverted copy of the vector R, $\overline{R}$, is that the redundancy created by the pair of vectors enables multichannel deserializer 202 to easily discern which rows are which in matrix G. After reading this specification, it will be clear to those skilled in the art how to make and use embodiments of the present invention in which the rows or columns or rows and columns of matrix G are transposed.

Serializer 403-$i$ transforms the two-dimensional matrix G into a vector, X, for transmission via serial communications channel 211-$i$, wherein X equals:

$$X = [\overline{R_0} \; R_0 \; c_{0,0} \cdots c_{K-1,0} \cdots \overline{R_{S-1}} \; R_{S-1} \; c_{0,S-1} \cdots c_{K-1,S-1}] \quad \text{(Eq. 10)}$$

After reading this specification, it will be clear to those skilled in the art how to make and use embodiments of the present invention in which the items in vector X are transposed.

Figure 6:
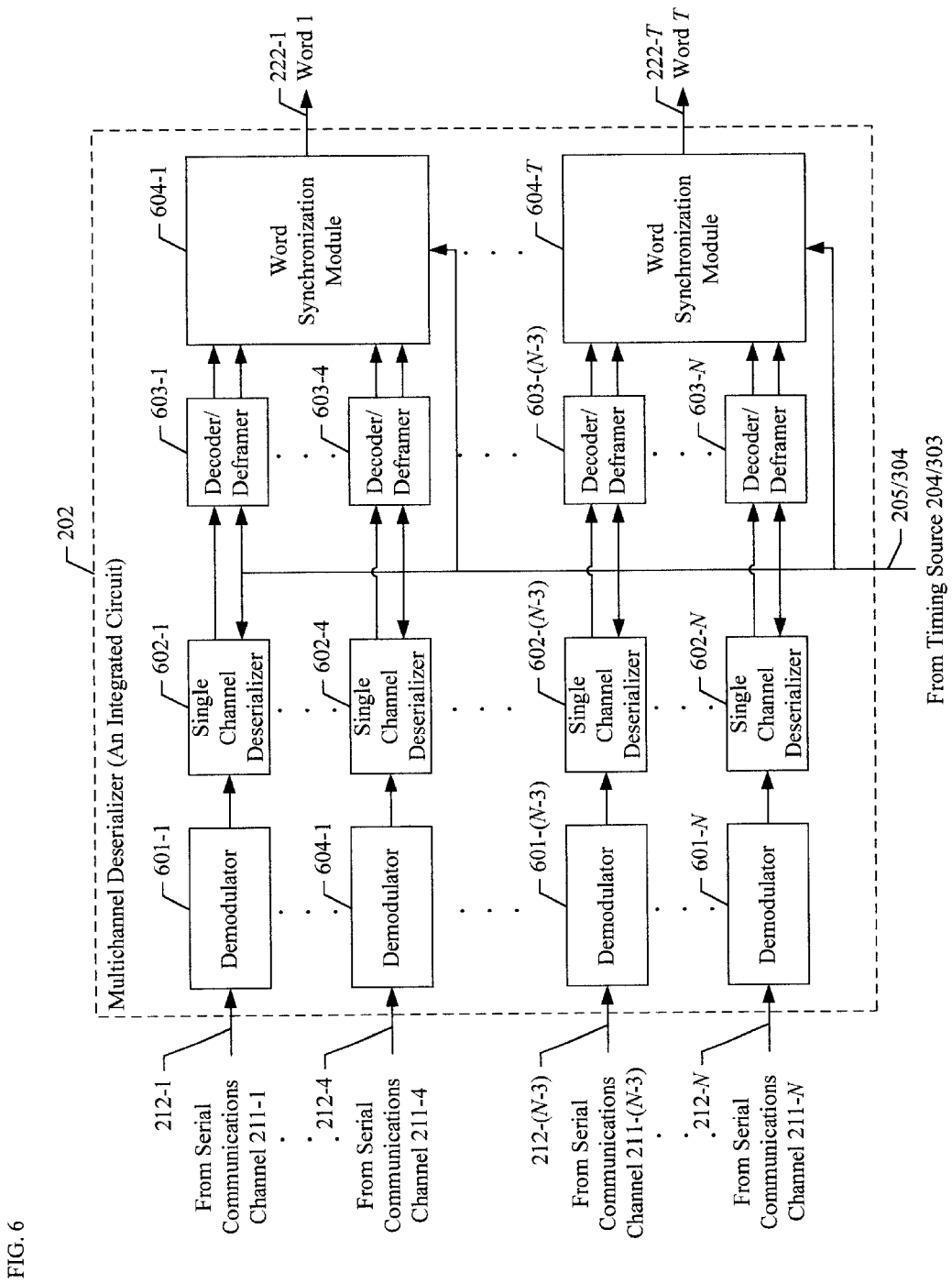
FIG. 6 depicts a block diagram of the salient components of multichannel deserializer 202.

FIG. 6 depicts a block diagram of the salient components of multichannel deserializer 202, which comprises: N demodulators 601-1 through 601-N, N single-channel deserializers 602-1 through 602-N, N decoder/deframers 603-1 through 603-N, and T word synchronization modules 604-1 through 604-T, interconnected as shown.

Demodulator 601-$i$, for i=1 to N, receives a modulated signal from serial communications channel 212-$i$, demodulates the modulated signal, and outputs a serialized stream of bits to single channel deserializer 602-1. It is well known to those skilled in the art how to make and use demodulator 601-$i$.

Single-channel deserializer 602-$i$, for i=1 to N, receives: (1) the serialized stream of bits from demodulator 401-$i$ and (2) the clock signal from timing source 204/303 and outputs each group of B bits in parallel to decoder/deframer 603-$i$. It is well known to those skilled in the art how to make and use single-channel deserializer 602-$i$. U.S. patent application Ser. No. 09/909,499, entitled "Deserializer," which is incorporated by reference, teaches one technique for making and using single-channel deserializer 602-$i$.

Decoder/deframer 603-$i$ receives groups of B bits in parallel from single-channel deserializer 602-$i$. More often than not, the B bits in a group include parts of two encoded symbols, and, therefore, decoder/deframer 603-$i$ must re-group the bits so that each group of B bits includes all of, and only parts of, one symbol. Furthermore, decoder/deframer 603-$i$ also generates a frame synchronization pulse to enable the delineation of adjacent frames, and performs forward error correction on the bits in the decoded K-bit symbols. The details of decoder/deframer 603-$i$ are described in detail below and with respect to FIG. 7.

Word synchronization module 604-$f$ receives M K-bit symbols and frame synchronization pulses from its M associated decoder/deframers and resynchronizes the words (i.e., regroups the symbols into words) in well-known fashion. It is well known to those skilled in the art how to make and use word synchronization module 604-$f$. The output of word synchronization module 604-$f$ is word f on bus 222-$f$.

Figure 7:
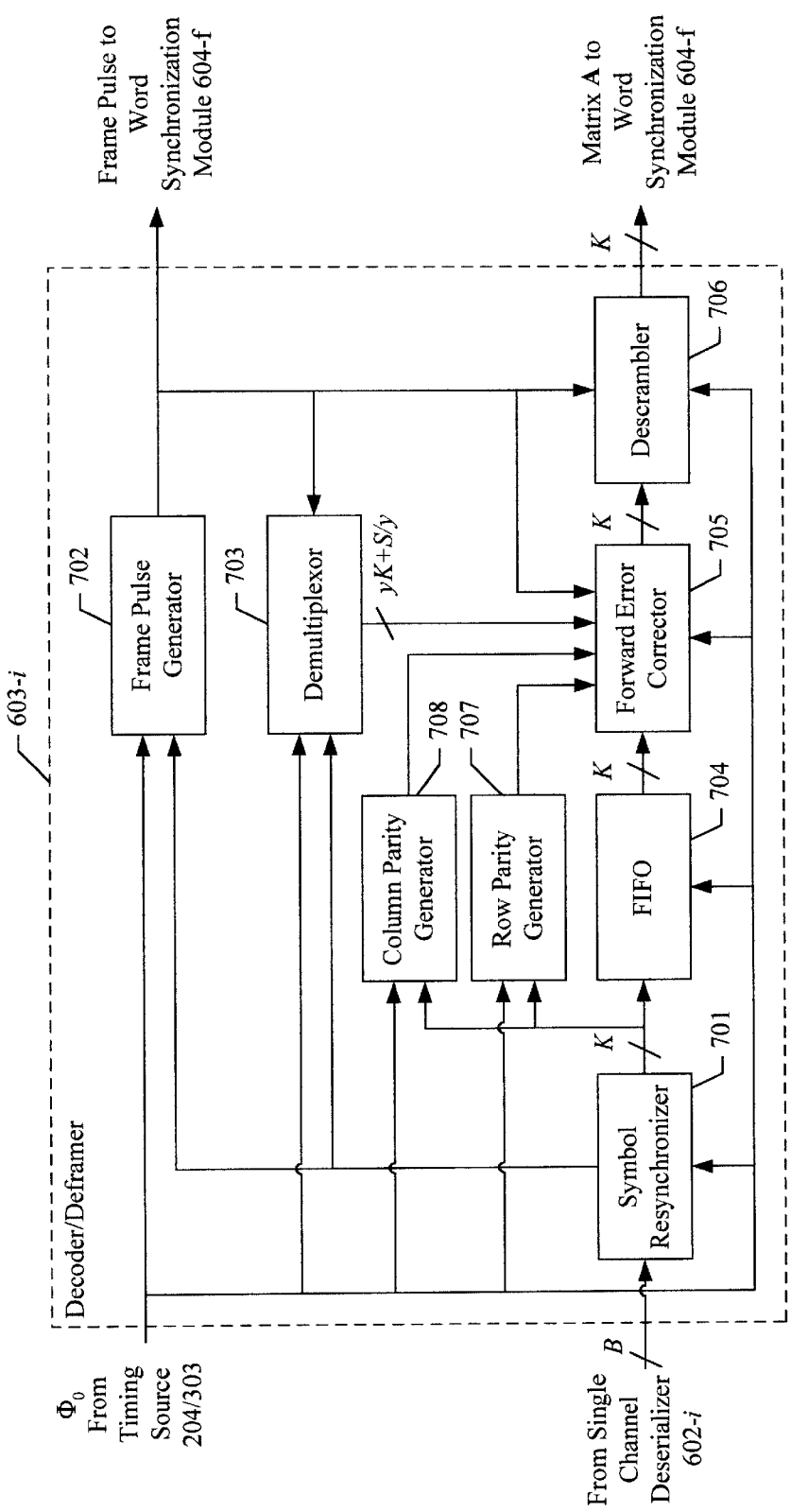
FIG. 7 depicts a block diagram of the salient components of decoder/deframer 603-i.

FIG. 7 depicts a block diagram of the salient components of decoder/deframer 603-$i$, which comprises: symbol resynchronizer 701, frame pulse generator 702, demultiplexor 703, first-in first-out memory ("FIFO") 704, forward error corrector 705, descrambler 706, row parity generator 707, and column parity generator 708, interconnected as shown.

Symbol resynchronzer 701 receives groups of B bits in parallel from single channel deserializer 602-$i$ and identifies which of those bits are associated with matrix C and which are associated with vectors R and $\overline{R}$. Symbol resynchronizer 701 identifies which bits are associated with vectors R and $\overline{R}$ by noting which pairs of bits are predominantly opposites of each other. The test is based on "predominance" rather than on "always" to account for possible bits errors in R and $\overline{R}$.

When symbol resynchronizer 701 identifies which pairs of bits are predominantly opposites of each other, and, thus represent the vectors R and $\overline{R}$, symbol resynchronizer 701 forwards the bits associated with matrix C to FIFO 704 and forwards the bits associated with vector R to both frame pulse generator 702 and to demultiplexor 703. The bits associated with the vector $\overline{R}$ are discarded by symbol resynchronizer 701. In some alternative embodiments of the present invention, a comparison of the vectors R and $\overline{R}$ can give symbol resynchronizer 701 an indication of the bit error rate on serial communications channel 212-$i$.

Frame pulse generator 702 generates a pulse that is indicative of the boundaries between successive frames (i.e., successive instances of the matrix C) so that:
  i. word synchronization module 604-$f$ can properly align and reconstitute the K-bit symbols from different decoder/framers into the W-bit words from which they were derived, and
  ii. demultiplexor 703 can distinguish between the row parity bits, the column parity bits and the framing bits from the succession of bits it receives from symbol resynchronizer 701.

Frame pulse generator 702 identifies the boundaries between successive frames by scanning the succession of parity bits and framing bits received from symbol resynchronizer 701 for the pattern of framing bits, $F_0$ through $F_{H-1}$, that were inserted into vector R by multiplexor 506. Because the parity bits are based on the parity of a scrambled matrix, the likelihood that frame pulse generator 702 will mistake a pattern of parity bits for a pattern of framing bits is inversely related to the magnitude of H, as determined by Equation 7, the nature of the pattern of the framing bits, $F_0$ through $F_{H-1}$, and the occurrence of 1's and 0's in matrix C.

Demultiplexor 703 performs the inverse function of multiplexor 506 in FIG. 5 and segregates the row parity bits, the column parity bits and the framing bits from the succession of bits received from symbol resynchronizer 701. Demultiplexor 703 identifies the row parity bits, the column parity bits and the framing bits from each other based on:
  i. the pattern used by multiplexor 506 for combining the row parity bits, the column parity bits and the framing bits, and
  ii. their phase alignment with respect to the framing pulse received from frame pulse generator 702.

Demultiplexor 703 discards the framing bits and transmits the yK row parity bits and the S/y column parity bits to forward error corrector 705 via a yK+S/y bit bus.

FIFO 704 receives the S K-bit decoded symbols from symbol resynchronizer 701 and holds them until demultiplexor 703 has output the yK row parity bits and the S/y column parity bits to forward error corrector 705.

Forward error corrector 705 groups S K-bit symbols as a single frame, matrix $\hat{C}$, which is an estimate of matrix C before forward error correction, based on the occurrence of the framing pulses from frame pulse generator 702 and corrects some or all of the bit errors that might have occurred in the transmission of the S K-bit decoded symbols. The output of forward error corrector 705 is the matrix C and is fed into descrambler 706. The details of forward error corrector 705 are described in detail below and with respect to FIG. 8.

Descrambler 706 performs the inverse function of scrambler 501 to recover the matrix A. In particular, descrambler 706 performs:

$$A = \Psi'(C) \qquad \text{(Eq. 11)}$$

in well-known fashion. The output of descrambler 706, matrix A, is output to word synchronization module 604-$f$ via a K-bit bus.

Row parity generator 707 is identical to row parity generator 503 in FIG. 5 and generates yK candidate row parity bits, $\hat{R}P_p$, for p=0 to yK−1, which will be compared with row parity bits from demultiplexor 703 to determine if a bit error has occurred in the row associated with the respective parity bits.

Similarly, column parity generator 707 is identical to column parity generator 504 in FIG. 5 and generates S/y candidate column parity bits, $\hat{C}P_q$, for q=0 to S/y−1, which will be compared with the column parity bits from demultiplexor 703 to determine if a bit error has occurred in the column associated with the respective parity bits.

Figure 8:
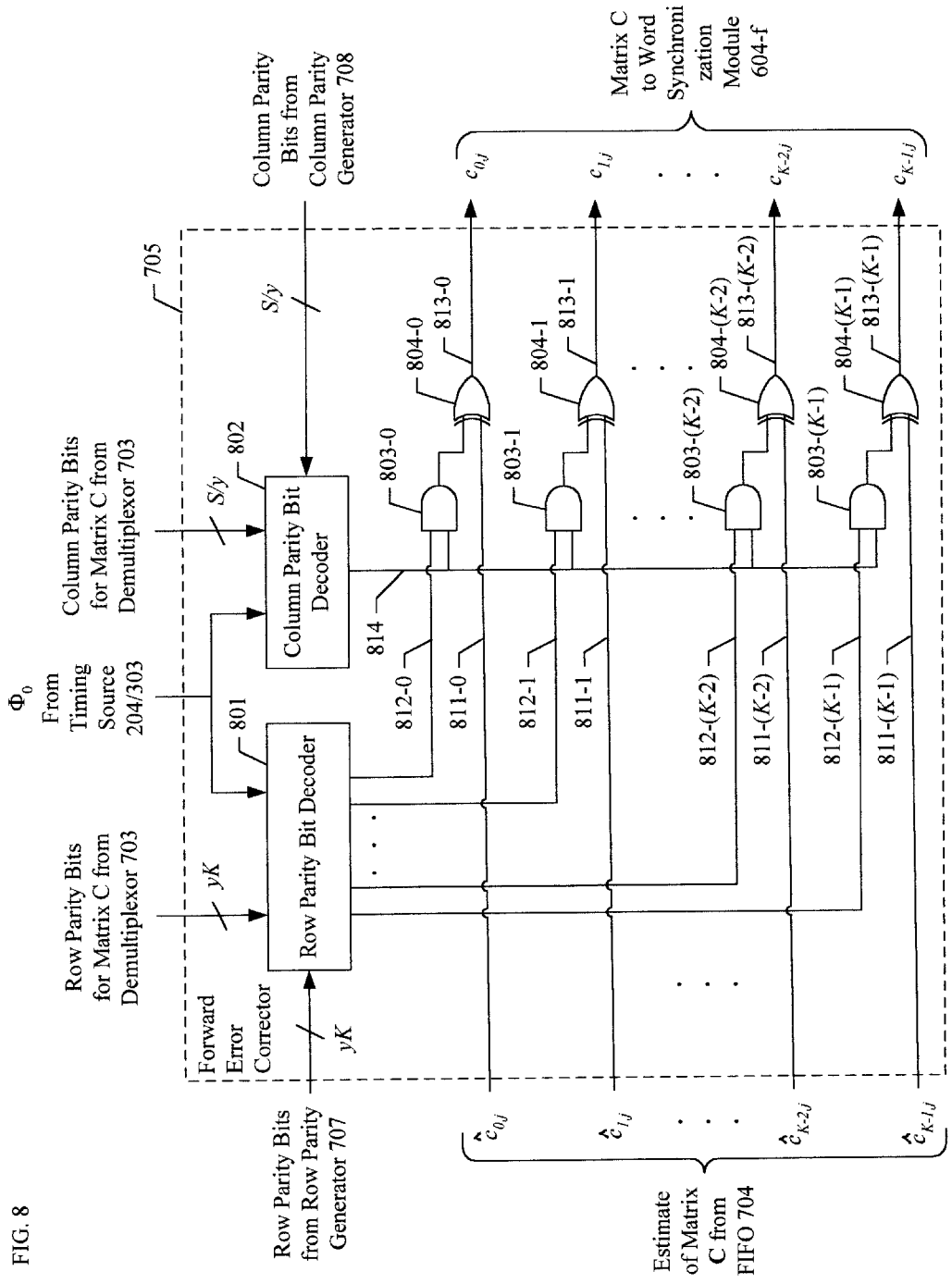
FIG. 8 depicts a block diagram of the salient components of forward error corrector 705.

FIG. 8 depicts a block diagram of the salient components of forward error corrector 705, which comprises: row parity bit decoder 801, column parity bit decoder 802, Boolean AND gates 803-0 though 803-(K−1), and Boolean Exclusive-OR gates 804-0 through 804-(K−1), interconnected as shown.

The estimate of matrix C, $\hat{C}$, is input into forward error corrector 705 one column at a time (i.e., K-bits at a time) with bit $\hat{c}_{vj}$ on lead 811-$v$, for v=0 to K−1 and j=0 to S−1. Forward error corrector 705 corrects, if necessary, the bits in $\hat{C}$ one column at a time to produce the matrix C with bit $c_{vj}$ on lead 813-$v$, for v=1 to K−1 and j=0 to S−1. The criteria for correcting the bits in $\hat{C}$ is described below.

Row parity bit detector 801 receives the yK row parity bits, $RP_p$, from demultiplexor 703 and the yK row parity bits, $\hat{R}P_p$, from row parity generator 707, and compares them bit-wise to determine if a bit error has occurred in a row of matrix D. In particular, row parity bit detector 801 computes an error term, $ER_p$, which is equal to:

$$ER_p = RP_p \oplus \hat{R}P_p \qquad \text{(Eq. 12)}$$

and outputs the value of $ER_v$ to Boolean AND gate 803-$v$ for j=0 to S/y−1 and $ER_{v+K}$ to Boolean AND gate 803-$v$ for j=S/y to S−1.

Similarly, column parity bit decoder 802 receives the S/y column parity bits, $CP_q$, from demultiplexor 703 and the S/y column parity bits, $\hat{C}P_q$, from column parity generator 708, and compares them bit-wise to determine if a bit error has occurred in a column of matrix D. In particular, column parity bit detector 802 computes an error term, $EC_q$, which is equal to:

$$EC_q = RC_q \oplus \hat{R}C_q \qquad \text{(Eq. 13)}$$

and outputs the value of $EC_{j \bmod y}$ onto lead 814.

The net effect of forward error detector 705 is to invert an estimate of a bit in matrix $\hat{C}$ when and only when both the row parity and the column parity for that bit indicate that an error has occurred. In other words, forward error detector

705 inverts the received a bit in $\hat{C}$, as designated by $\hat{d}_{i,j}$ in matrix $\hat{D}$ when and only when $ER_i$ and $EC_j$ indicate an error, wherein:

$$\hat{D}=\Lambda(\hat{C}) \quad \text{(Eq. 14)}$$

and $$\hat{D} = \begin{bmatrix} \hat{c}_{0,0} & \cdots & \hat{c}_{0,\frac{S}{2}-1} \\ \vdots & \ddots & \vdots \\ \hat{c}_{K-1,0} & \cdots & \hat{c}_{K-1,\frac{S}{2}-1} \\ \hat{c}_{0,\frac{S}{2}} & \cdots & \hat{c}_{0,S-1} \\ \vdots & \ddots & \vdots \\ \hat{c}_{K-1,\frac{S}{2}} & \cdots & \hat{c}_{K-1,S-1} \end{bmatrix} = \begin{bmatrix} \hat{d}_{0,0} & \cdots & \hat{d}_{0,\frac{S}{2}-1} \\ \vdots & \ddots & \vdots \\ \hat{d}_{2K-1,0} & \cdots & \hat{d}_{2K-1,\frac{S}{2}-1} \end{bmatrix} \quad \text{(Eq. 15)}$$

It is to be understood that the above-described embodiments are merely illustrative of the present invention and that many variations of the above-described embodiments can be devised by those skilled in the art without departing from the scope of the invention. It is therefore intended that such variations be included within the scope of the following claims and their equivalents.

What is claimed is:

1. A method comprising:

receiving a matrix C of bits, wherein said matrix C has dimensions of S by K and wherein both S and K are positive integers;

generating a plurality of row parity bits that are indicative of the parity of a row of bits in a matrix D that has dimensions of S/y by yK, wherein S/y and yK are positive integers, wherein y is a positive integer other than one, and wherein matrix D is based on a shuffling function of matrix C; and transmitting said matrix C of bits and said plurality of row parity bits.

2. The method of claim 1 wherein S/y+yK<S+K.

3. The method of claim 1 further comprising:

generating a plurality of column parity bits that are indicative of the parity of a column of bits in matrix D; and transmitting said matrix C of bits, said plurality of row parity bits, and said plurality of column parity bits.

* * * * *